US010333536B2

(12) United States Patent
Maki et al.

(10) Patent No.: US 10,333,536 B2
(45) Date of Patent: Jun. 25, 2019

(54) ATOMIC OSCILLATOR, AND ELECTRONIC APPARATUS

(71) Applicant: Seiko Epson Corporation, Tokyo (JP)

(72) Inventors: Yoshiyuki Maki, Suwa (JP); Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 102 days.

(21) Appl. No.: 15/695,567

(22) Filed: Sep. 5, 2017

(65) Prior Publication Data
US 2018/0069559 A1  Mar. 8, 2018

(30) Foreign Application Priority Data

Sep. 7, 2016 (JP) .................. 2016-174575

(51) Int. Cl.
| | |
|---|---|
| *H03L 7/26* | (2006.01) |
| *H01S 5/024* | (2006.01) |
| *H03B 17/00* | (2006.01) |
| *H01S 5/00* | (2006.01) |
| *G04F 5/14* | (2006.01) |
| *H01S 5/068* | (2006.01) |
| *H01S 5/0687* | (2006.01) |
| *H01S 5/022* | (2006.01) |
| *H01S 5/183* | (2006.01) |

(52) U.S. Cl.
CPC .............. *H03L 7/26* (2013.01); *G04F 5/145* (2013.01); *H01S 5/0085* (2013.01); *H01S 5/02415* (2013.01); *H01S 5/06804* (2013.01); *H03B 17/00* (2013.01); *H01S 5/005* (2013.01); *H01S 5/02208* (2013.01); *H01S 5/02276* (2013.01); *H01S 5/0687* (2013.01); *H01S 5/183* (2013.01)

(58) Field of Classification Search
CPC ........................................................ H03L 7/26
USPC ..................................................... 331/3, 94.1
See application file for complete search history.

(56) References Cited

U.S. PATENT DOCUMENTS

| | | | |
|---|---|---|---|
| 6,320,472 B1 | 11/2001 | Vanier | |
| 2011/0187465 A1 | 8/2011 | Youngner et al. | |
| 2016/0105150 A1* | 4/2016 | Hayashi ................ | H03B 17/00 331/94.1 |

* cited by examiner

*Primary Examiner* — Joseph Chang
(74) *Attorney, Agent, or Firm* — Harness, Dickey & Pierce, P.L.C.

(57) ABSTRACT

An atomic oscillator includes: an atomic cell in which an alkali metal is sealed; a light-emitting element that emits light to be radiated to the atomic cell; a light-receiving element that detects the light transmitted through the atomic cell; a first optical element that has light transmittance and is disposed between the atomic cell and the light-emitting element; and a second optical element that has light transmittance and is disposed between the first optical element and the atomic cell. The first optical element reflects the light from the light-emitting element toward the light-emitting element in a first direction inclined with respect to an optical axis of the light. The second optical element reflects the light from the light-emitting element toward the light-emitting element in a second direction inclined in a direction different from the first direction with respect to the optical axis of the light.

11 Claims, 9 Drawing Sheets

ATOMIC OSCILLATOR, AND ELECTRONIC APPARATUS

This application claims priority to Japanese Patent Application No. 2016-174575, filed Sep. 7, 2016, the entirety of which is hereby incorporated by reference.

BACKGROUND

1. Technical Field

The present invention relates to an atomic oscillator, and an electronic apparatus.

2. Related Art

As oscillators having high long-term frequency stability, there are known atomic oscillators oscillated based on energy transition of alkali metal atoms such as rubidium or cesium, (for example, see U.S. Pat. No. 6,320,472).

For example, as disclosed in U.S. Pat. No. 6,320,472, an atomic oscillator includes a cell (atomic cell) in which a gaseous alkali metal is sealed, a semiconductor laser element that emits light to be radiated to the cell, and a light detector that detects the light transmitted through the cell. In the atomic oscillator disclosed in U.S. Pat. No. 6,320,472, a lens and a polarizer are each disposed along a surface perpendicular to an optical axis between the cell and the semiconductor laser element.

In the atomic oscillator disclosed in U.S. Pat. No. 6,320,472, the light from the semiconductor laser element is reflected by the lens and the polarizer to be incident as return light on the semiconductor laser element, and thus there is a problem that the wavelength of the light from the semiconductor laser element varies. This problem may be a cause that has an adverse influence on oscillation characteristics of the atomic oscillator.

SUMMARY

An advantage of some aspects of the invention is to provide an atomic oscillator capable of improving oscillation characteristics, and an electronic apparatus and a vehicle including the atomic oscillator.

The advantage can be achieved by the following configurations.

An atomic oscillator according to an aspect of the invention includes: an atomic cell in which an alkali metal is sealed; a light-emitting element that emits light to be radiated to the atomic cell; a light-receiving element that detects the light transmitted through the atomic cell; a first optical element that has light transmittance and is disposed between the atomic cell and the light-emitting element; and a second optical element that has light transmittance and is disposed between the first optical element and the atomic cell. The first optical element reflects the light from the light-emitting element toward the light-emitting element in a first direction inclined with respect to an optical axis of the light. The second optical element reflects the light from the light-emitting element toward the light-emitting element in a second direction inclined in a direction different from the first direction with respect to the optical axis of the light.

According to the atomic oscillator, the first and second optical elements each reflect the light from the light-emitting element toward the light-emitting element in the directions inclined with respect to the optical axis of the light. Therefore, it is possible to reduce return light to the light-emitting element. In particular, the second optical element reflects the light from the light-emitting element in the direction (the second direction) inclined in the different direction from the reflection direction (the first direction) in the first optical element with respect to the optical axis. Therefore, the light reflected by the second optical element is multiply reflected between the first optical element and the second optical element, and thus it is possible to reduce the return light to the light-emitting element. As a result, it is possible to effectively reduce the return light to the light-emitting element. In this way, it is possible to improve stability of the wavelength of the light from the light-emitting element and improve oscillation characteristics of the atomic oscillator.

In the atomic oscillator according to the aspect of the invention, it is preferable that an inclination angle of the second direction with respect to the optical axis of the light is greater than an inclination angle of the first direction with respect to the optical axis of the light.

With this configuration, it is possible to effectively reduce the return light of the light reflected by the second optical element with large light reflectivity to the light-emitting element. On the other hand, by causing the inclination angle in the first direction with respect to the optical axis of the light from the light-emitting element to be less than the inclination angle in the second direction, it is possible to exert necessary optical characteristics of the first optical element with a relatively simple configuration.

An atomic oscillator according to another aspect of the invention includes: an atomic cell in which an alkali metal is sealed; a light-emitting element that emits light to be radiated to the atomic cell; a light-receiving element that detects the light transmitted through the atomic cell; a first optical element that has the first surface having light transmittance, is disposed between the atomic cell and the light-emitting element, and includes a first surface which is inclined with respect to a surface perpendicular to an optical axis of the light and reflects the light from the light-emitting element; and a second optical element that has the second surface having light transmittance, is disposed between the first optical element and the atomic cell, and includes a second surface which is inclined in a different direction from the first surface with respect to the surface perpendicular to the optical axis of the light and reflect the light from the light-emitting element.

According to the atomic oscillator, the first and second optical elements each reflect the light from the light-emitting element toward the light-emitting element in the directions inclined with respect to the optical axis of the light. Therefore, it is possible to reduce return light to the light-emitting element. In particular, the second optical element can reflect the light from the light-emitting element in the direction (the second direction) inclined in the different direction from the reflection direction (the first direction) in the first optical element with respect to the optical axis. Therefore, the light reflected by the second optical element is multiply reflected between the first optical element and the second optical element, and thus it is possible to reduce the return light to the light-emitting element. As a result, it is possible to effectively reduce the return light to the light-emitting element. In this way, it is possible to improve stability of the wavelength of the light from the light-emitting element and improve oscillation characteristics of the atomic oscillator.

In the atomic oscillator according to the aspect of the invention, it is preferable that an inclination angle of the second surface with respect to the surface perpendicular to the optical axis of the light is greater than an inclination angle of the first surface with respect to the surface perpendicular to the optical axis of the light.

With this configuration, it is possible to effectively reduce the return light of the light reflected by the second optical element with large light reflectivity to the light-emitting element. On the other hand, by causing the inclination angle of the first surface with respect to the surface perpendicular to the optical axis of the light from the light-emitting element to be less than the inclination angle of the second surface, it is possible to exert necessary optical characteristics of the first optical element with a relatively simple configuration.

In the atomic oscillator according to the aspect of the invention, it is preferable that the second optical element is a reflective light reduction filter.

With this configuration, it is possible to reduce the light from the light-emitting element and radiate the light to the atomic cell. The reflective light reduction filter has the advantage that a problem of an increase in temperature caused due to light absorption as in an absorption light reduction filter rarely arises.

It is preferable that the atomic oscillator according to the aspect of the invention includes a lens that is disposed between the atomic cell and the second optical element.

With this configuration, it is possible to adjust a radiation angle of the light from the light-emitting element. Even when the lens is disposed along a surface vertical to the optical axis of the light from the light-emitting element, reflected light in the lens is reflected by each of the first and second optical elements, and thus it is possible to reduce the return light to the light-emitting element from the reflected light. In addition, since it is not necessary to dispose another lens between the light-emitting element and the second optical element, reflected light in the lens disposed in this way does not become the return light to the light-emitting element.

It is preferable that the atomic oscillator according to the aspect of the invention includes a quarter wavelength plate that is disposed between the atomic cell and the second optical element.

With this configuration, polarization of the light from the light-emitting element can be converted from linear polarization to circular polarization. Even when the quarter wavelength plate is disposed along the surface vertical to the optical axis of the light from the light-emitting element, reflected light in the quarter wavelength plate is reflected by each of the first and second optical elements, and thus it is possible to reduce the return light to the light-emitting element from the reflected light. In addition, since it is not necessary to dispose another quarter wavelength plate between the light-emitting element and the second optical element, reflected light in the quarter wavelength plate disposed in this way does not become the return light to the light-emitting element.

It is preferable that the atomic oscillator according to the aspect of the invention includes a first holding member that includes a first engagement portion and holds the first optical element; and a second holding member that includes a second engagement portion engaging with the first engagement portion and holds the second optical element and the relative positions of the first and second holding members are decided by engagement of the first and second engagement portions.

With this configuration, it is possible to mutually position the first and second optical elements simply and at high precision.

It is preferable that the atomic oscillator according to the aspect of the invention includes a package that accommodates the light-emitting element, and the first optical element and the first holding member configure at least a part of the package.

With this configuration, it is possible to mutually position the light-emitting element and the first optical element simply and at high precision. In addition, since the first optical element can be installed at a relatively small inclination angle, it is possible to reduce an increase in the size of the package.

In the atomic oscillator according to the aspect of the invention, it is preferable that reflectivity of the second optical element is higher than reflectivity of the first optical element.

With this configuration, even when the inclination angle in the first direction with respect to the optical axis of the light from the light-emitting element to be less than the inclination angle in the second direction, an influence of the return light to the light-emitting element is small.

An electronic apparatus according to an aspect of the invention includes the atomic oscillator according to the aspect of the invention.

According to the electronic apparatus, it is possible to improve characteristics of the electronic apparatus using excellent oscillation characteristics of the atomic oscillator.

A vehicle according to still an aspect of the invention includes the atomic oscillator according to the aspect of the invention.

According to the vehicle, it is possible to improve characteristics of the vehicle using excellent oscillation characteristics of the atomic oscillator.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an atomic oscillator, an electronic apparatus, and a vehicle according to the invention will be described with reference to the appended drawings according to embodiments.

1. Atomic Oscillator

First, an atomic oscillator will be described.

Figure 1:
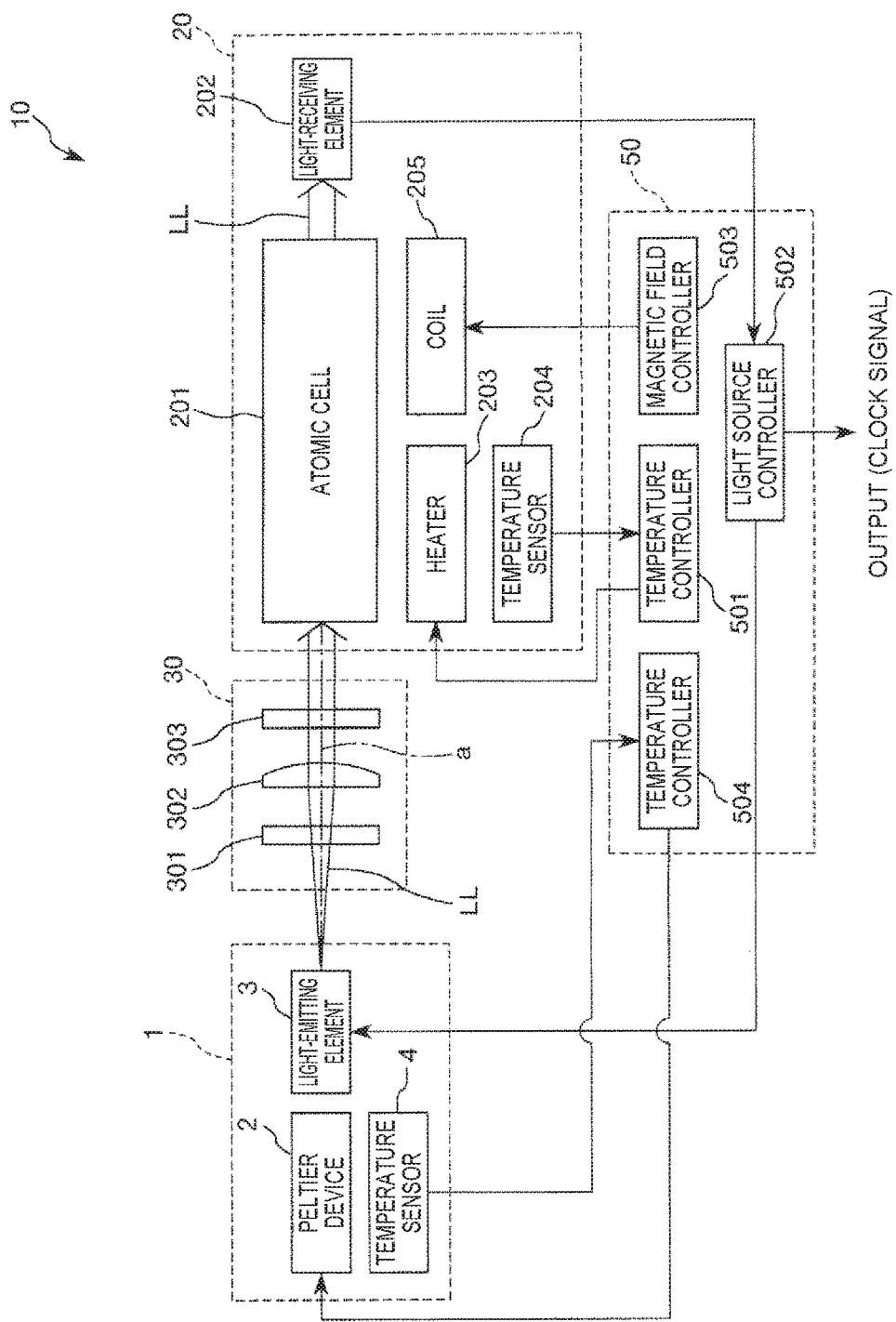
FIG. 1 is a schematic diagram illustrating an atomic oscillator according to an embodiment.

FIG. 1 is a schematic diagram illustrating an atomic oscillator according to an embodiment.

An atomic oscillator 10 illustrated in FIG. 1 is an atomic oscillator that uses coherent population trapping (CPT) in which a phenomenon occurs in which two pieces of resonance light are transmitted without being absorbed by alkali metal atoms when the two pieces of resonance light with specific different wavelengths are simultaneously radiated to the alkali metal atoms. The phenomenon of the coherent population trapping is also called an electromagnetically induced transparency (EIT) phenomenon.

As illustrated in FIG. 1, the atomic oscillator 10 includes a light-emitting element module 1, an atomic cell unit 20, an optical system unit 30 installed between the light-emitting element module 1 and the atomic cell unit 20, and a controller 50 that controls operations of the light-emitting element module 1 and the atomic cell unit 20. Hereinafter, an overview of the atomic oscillator 10 will be described first.

The light-emitting element module 1 includes a Peltier device 2, a light-emitting element 3, and a temperature sensor 4. The light-emitting element 3 emits linearly polarized light LL containing two types of light with different frequencies. The temperature sensor 4 detects temperature of the light-emitting element 3. The Peltier device 2 adjusts the temperature of the light-emitting element 3 (heats or cools the light-emitting element 3).

The optical system unit 30 includes a light reduction filter 301, a lens 302, and a quarter wavelength plate 303. The light reduction filter 301 reduces the intensity of the light LL from the above-described light-emitting element 3. The lens 302 adjusts the angle of radiation of the light LL (for example, adjusts the light LL to parallel light). The quarter wavelength plate 303 converts two types of light with different frequencies contained in the light LL from linearly polarized light to circularly polarized light (right-handed circularly polarized light or left-handed circularly polarized light).

The atomic cell unit 20 includes an atomic cell 201, a light-receiving element 202, a heater 203, a temperature sensor 204, and a coil 205.

The atomic cell 201 has light transmittance and alkali metal is sealed inside the atomic cell 201. An alkali metal atom has energy levels of three level systems formed by two different ground levels and an excited level. The light LL from the light-emitting element 3 is incident on the atomic cell 201 via the light reduction filter 301, the lens 302, and the quarter wavelength plate 303. Then, the light-receiving element 202 receives and detects the light LL passing through the atomic cell 201.

The heater 203 heats the alkali metal inside the atomic cell 201 to change at least a part of the alkali metal into a gas state. The temperature sensor 204 detects temperature of the atomic cell 201. The coil 205 applies a magnetic field in a predetermined direction to the alkali metal inside the atomic cell 201 to perform Zeeman splitting on the energy levels of the alkali metal atoms. When the pair of pieces of circularly polarized resonance light described above are radiated to the alkali metal atoms in a state in which the alkali metal atoms are subjected to the Zeeman splitting in this way, the number of alkali metal atoms in a desired energy level among the plurality of levels at which the alkali metal atoms are subjected to the Zeeman splitting can be relatively greater than the number of alkali metal atoms at another energy level. Therefore, it is possible to increase the number of atoms realizing a desired EIT phenomenon, raise a desired EIT signal, and consequently improve oscillation characteristics of the atomic oscillator 10.

The controller 50 includes a temperature controller 501, a light source controller 502, a magnetic field controller 503, and a temperature controller 504. Based on a detection result of the temperature sensor 204, the temperature controller 501 controls conduction to the heater 203 such that a desired temperature is maintained inside the atomic cell 201. The magnetic field controller 503 controls conduction to the coil 205 such that the magnetic field generated by the coil 205 is constant. Based on a detection result of the temperature sensor 4, the temperature controller 504 controls conduction to the Peltier device 2 such that the temperature of the light-emitting element 3 is maintained at a desired temperature (within a temperature region).

Based on a detection result of the light-receiving element 202, the light source controller 502 controls the frequencies of two types of light contained in the light LL from the light-emitting element 3 such that an EIT phenomenon occurs. Here, the EIT phenomenon occurs when the two types of light become the pair of pieces of resonance light with a frequency difference equivalent to an energy difference between two ground levels of the alkali metal atoms inside the atomic cell 201. The light source controller 502 includes a voltage controlled crystal oscillator (not illustrated) of which an oscillation frequency is controlled for stabilization in synchronization with control of the frequencies of the two types of light described above and outputs an output signal of the voltage controlled crystal oscillator (VCXO) as an output signal (clock signal) of the atomic oscillator 10.

The overview of the atomic oscillator 10 has been described. Hereinafter, a more specific configuration of the atomic oscillator 10 will be described with reference to FIGS. 2 and 3.

Figure 2:
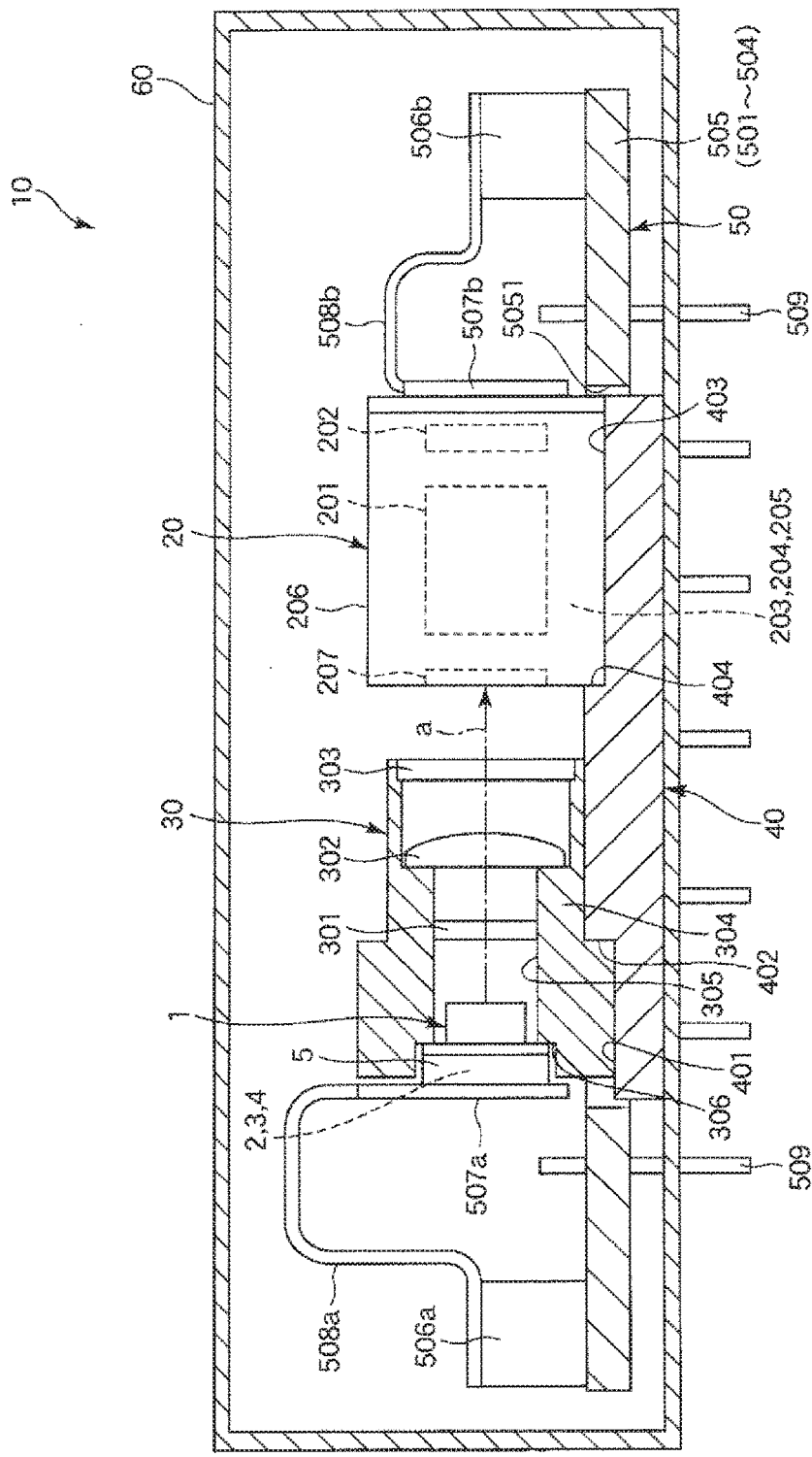
FIG. 2 is a sectional side view illustrating the atomic oscillator illustrated in FIG. 1.
Figure 3:
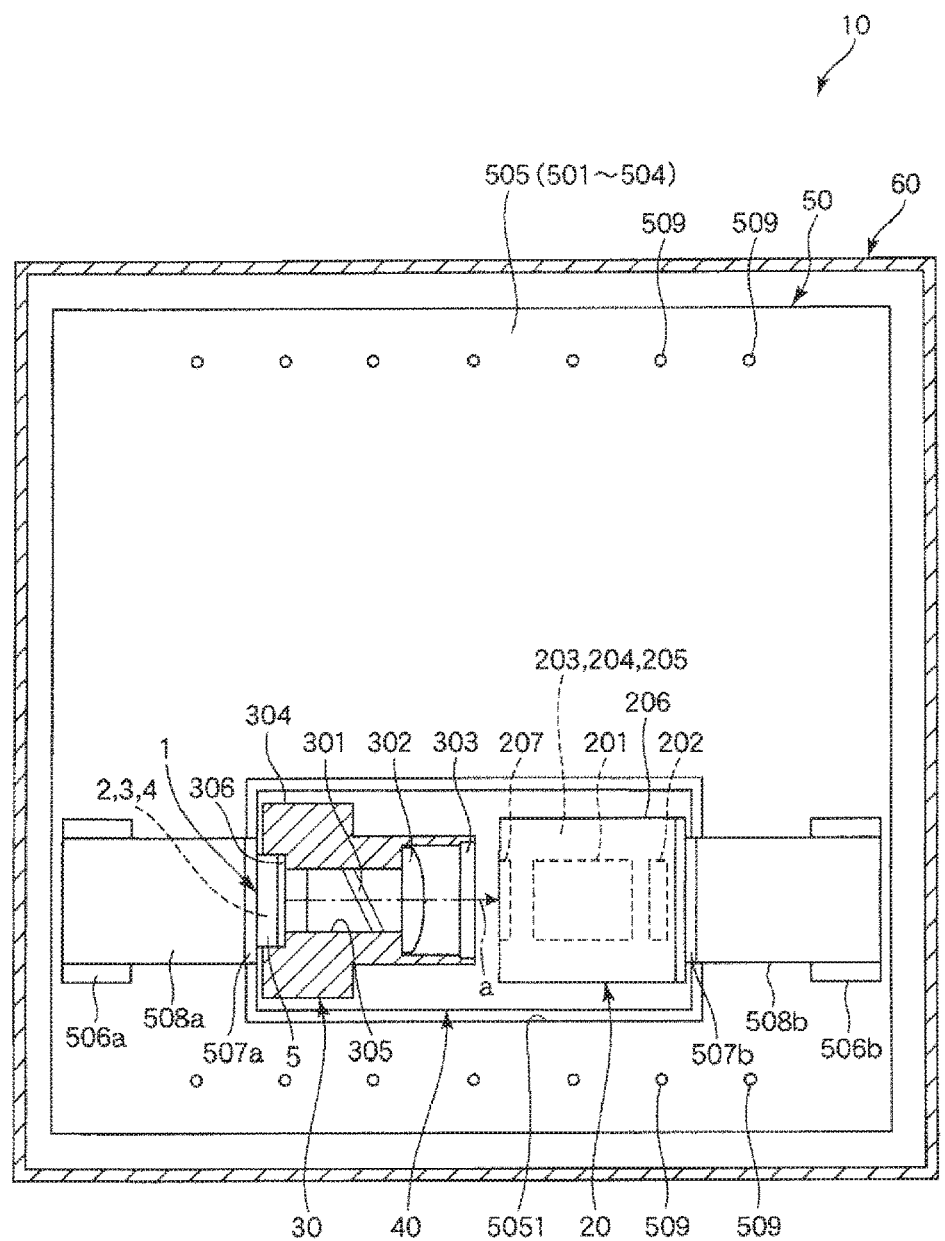
FIG. 3 is a plan view illustrating the atomic oscillator illustrated in FIG. 2.

FIG. 2 is a sectional side view illustrating the atomic oscillator illustrated in FIG. 1. FIG. 3 is a plan view illustrating the atomic oscillator illustrated in FIG. 2. Hereinafter, the upper side in FIG. 2 is referred to as a "top" and the lower side is referred to as a "bottom" to facilitate the description.

As illustrated in FIG. 2, the atomic oscillator 10 includes a light-emitting element module 1, an atomic cell unit 20, an optical system unit 30 that holds the light-emitting element module 1, a hold member 40 that collectively holds the atomic cell unit 20 and the optical system unit 30, a controller 50 that is electrically connected to the light-emitting element module 1 and the atomic cell unit 20, and a package 60 that accommodates them.

The light-emitting element module 1 includes the Peltier device 2, the light-emitting element 3, the temperature sensor 4, and a package 5 accommodating them. The light-emitting element module 1 will be described below in detail.

The optical system unit 30 includes a light reduction filter 301, a lens 302, a quarter wavelength plate 303, and a holder 304 that holds them. Here, the holder 304 includes through-holes 305 of which both ends are open. The through-hole 305 is a passage region of the light LL. The light reduction filter 301, the lens 302, and the quarter wavelength plate 303 are disposed in this order inside the through-hole 305. As illustrated in FIG. 3, the light reduction filter 301 is fixed to the holder 304 by an adhesive or the like (not illustrated) to be inclined with respect to a surface that has the optical axis a as a normal line (a surface perpendicular to the optical axis). The lens 302 and the quarter wavelength plate 303 are fixed to the holder 304 by an adhesive or the like (not illustrated) along a surface that has the optical axis a as a normal line (a surface perpendicular to the optical axis). The light-emitting element module 1 is mounted on an end of the through-hole 305 close to the light reduction filter 301 (the left of FIG. 2) by a mounting member (not illustrated). The holder 304 is formed of, for example, a metal material such as aluminum and has a heat dissipation property. In this way, it is possible to efficiently dissipate the heat from the light-emitting element module 1.

The optical system unit 30 may not include at least one of the light reduction filter 301 and the lens 302 depending on the intensity of the light LL from the light-emitting element 3, an angle of radiation, or the like. The optical system unit 30 may include an optical element other than the light reduction filter 301, the lens 302, and the quarter wavelength plate 303. The disposition order of the light reduction filter 301, the lens 302, and the quarter wavelength plate 303 is not limited to the illustrated order and the light reduction filter 301, the lens 302, and the quarter wavelength plate 303 may be disposed in any order.

The atomic cell unit 20 includes the atomic cell 201, a light-receiving element 202, a heater 203, a temperature sensor 204, a coil 205, and a package 206 that accommodates them.

An alkali metal such as rubidium, cesium, or sodium in a gaseous form is sealed inside the atomic cell 201. In the atomic cell 201, a noble gas such as argon or neon or an inert gas such as nitrogen may be sealed as a buffer gas along with the alkali metal gas, as necessary.

Although not illustrated, the atomic cell 201 includes, for example, a trunk that has a through-hole with a pillar shape and one pair of window portions that form an inner space sealed airtight by sealing both openings of the through-hole of the trunk. Here, the light LL incident on the atomic cell 201 is transmitted through one window portion between the pair of window portions and the light LL emitted from the inside of the atomic cell 201 is transmitted through the other window portion. Accordingly, a material used to form each window portion may have transmittance with respect to the light LL and is not particularly limited. For example, a glass material or a quartz crystal can be exemplified. On the other hand, a material used to form the trunk is not particularly limited and a metal material, a resin material, a glass material, a silicon material, and a quartz crystal can be exemplified. From the viewpoint of workability or joining with each window portion, it is preferable to use a glass material or a silicon material. A method of joining the trunk with each window portion can be decided according to the material and is not particularly limited. For example, a direct joining method or an anode joining method can be used.

The light-receiving element 202 is disposed to be opposite to the light-emitting element module 1 with respect to the atomic cell 201. The light-receiving element 202 is not particularly limited as long as the light-receiving element can detect the intensity of the light LL (the pair of pieces of resonance light) transmitted through the atomic cell 201. For example, a solar cell or a light detector (light-receiving element) such as a photodiode is exemplified.

Although not illustrated, for example, the heater 203 is disposed on the above-described atomic cell 201 or is connected to the atomic cell 201 via a thermal conductive member such as a metal. The heater 203 is not particularly limited as long as the atomic cell 201 (more specifically, the alkali metal inside the atomic cell 201) can be heated. For example, a Peltier device or any of various heaters having a heating resistor can be exemplified.

Although not illustrated, for example, the temperature sensor 204 is disposed near the atomic cell 201 or the heater 203. The temperature sensor 204 is not particularly limited as long as the temperature of the atomic cell 201 or the heater 203 can be detected. For example, various known temperature sensors such as a thermistor or a thermocouple can be exemplified.

Although not illustrated, for example, the coil 205 is a solenoid type coil disposed to be wound around the outer circumference of the atomic cell 201 or a pair of Helmholtz coils facing each other with the atomic cell 201 interposed therebetween. The coil 205 generates a magnetic field in a direction (a parallel direction) along the optical axis a of the light LL inside the atomic cell 201. In this way, a gap between different energy levels at which the alkali metal atoms inside the atomic cell 201 are degenerated can be spread by Zeeman splitting to improve a resolution and the line width of the EIT signal can be reduced. The magnetic field generated by the coil 205 may be one magnetic field between a direct-current magnetic field and an alternating-current magnetic field or may be a magnetic field in which a direct-current magnetic field and an alternating-current magnetic field are superimposed.

Although not illustrated, the package 206 includes, for example, a plate-shaped substrate and a cover joined to the substrate. An airtight space in which the atomic cell 201, the light-receiving element 202, the heater 203, the temperature sensor 204, and the coil 205 described above are accommodated is formed between the substrate and the cover. Here, the substrate directly or indirectly holds the atomic cell 201, the light-receiving element 202, the heater 203, the temperature sensor 204, and the coil 205. A plurality of terminals electrically connected to the light-receiving element 202, the heater 203, the temperature sensor 204, and the coil 205 are installed on the outer surface of the substrate. On the other hand, the cover forms a bottom cylinder of which one end is open and the opening of which is blocked by the substrate. A window portion 207 that has transmittance for the light LL is installed at the other end (bottom portion) of the cover.

A material of portions other than the window portion of the cover and the substrate of the package 206 is not particularly limited. For example, a ceramics or a metal can be exemplified. As a material of the window portion 207, for example, a glass material can be exemplified. A method of joining the substrate to the cover is not particularly limited. For example, soldering, seam welding, or energy line welding (laser welding, electron beam welding, or the like) can be exemplified. The package 206 is internally more depressurized than the atmospheric pressure. In this way, it is possible to control the temperature of the atomic cell 201 simply and with high precision. As a result, it is possible to improve the characteristics of the atomic oscillator 10.

The hold member 40 is formed in a plate shape. The atomic cell unit 20 and the optical system unit 30 described above are placed on one surface of the hold member 40. The hold member 40 has an installation surface 401 formed along the shape of the lower surface of the holder 304 of the optical system unit 30. A stepped portion 402 is formed on the installation surface 401. The stepped portion 402 engages with the stepped portion of the lower surface of the holder 304 and regulates movement of the holder 304 toward the side of the atomic cell unit 20 (the right side of FIG. 2). Similarly, the hold member 40 has an installation surface 403 formed along the shape of the lower surface of the package 206 of the atomic cell unit 20. A stepped portion 404 is formed on the installation surface 403. The stepped portion 404 engages with the end surface of the package 206 (the end surface on the left side of FIG. 2) and regulates movement of the package 206 toward the side of the optical system unit 30 (the left side of FIG. 2).

In this way, the hold member 40 can regulate a relative positional relation between the atomic cell unit 20 and the optical system unit 30. Thus, since the light-emitting element module 1 is fixed to the holder 304, a relative positional relation of the light-emitting element module 1 relative to the atomic cell unit 20 and the optical system unit 30 is also regulated. Here, the package 206 and the holder 304 are fixed to the hold member 40 by a fixing member such as a screw (not illustrated). The hold member 40 is fixed to the package 60 by a fixing member such as a screw (not illustrated). The hold member 40 is formed of, for example, a metal material such as aluminum and has a heat dissipation property. In this way, it is possible to efficiently dissipate the heat from the light-emitting element module 1.

As illustrated in FIG. 3, the controller 50 includes a circuit substrate 505, two connectors 506a and 506b installed on the circuit substrate 505, a rigid wiring substrate 507a connected to the light-emitting element module 1, a rigid wiring substrate 507b connected to the atomic cell unit 20, a flexible wiring substrate 508a connecting the connector 506a to the rigid wiring substrate 507a, a flexible wiring substrate 508b connecting the connector 506b to the rigid wiring substrate 507b, and a plurality of lead pins 509 penetrating the circuit substrate 505.

Here, an integrated circuit (IC) chip (not illustrated) is installed in the circuit substrate 505. The IC chip functions as the temperature controller 501, the light source controller 502, the magnetic field controller 503, and the temperature controller 504 described above. The circuit substrate 505 includes a through-hole 5051 into which the above-described hold member 40 is inserted. The circuit substrate 505 is held by the package 60 via the plurality of lead pins 509. The plurality of lead pins 509 penetrate inside and outside the package 60 and are electrically connected to the circuit substrate 505.

The configuration in which the circuit substrate 505 is electrically connected to the light-emitting element module 1 and the configuration in which the circuit substrate 505 is electrically connected to the atomic cell unit 20 are not limited to the connectors 506a and 506b, the rigid wiring substrates 507a and 507b, and the flexible wiring substrates 508a and 508b illustrated in the drawing, but other known connectors and wirings may be used.

The package 60 is formed of, for example, a metal material such as Kovar and has a magnetic shielding property. In this way, it is possible to reduce an adverse influence of an external magnetic field on the characteristics of the atomic oscillator 10. The package 60 may be internally depressurized or may be at the atmospheric pressure.

Detailed Description of Light-Emitting Element Module

Figure 4:
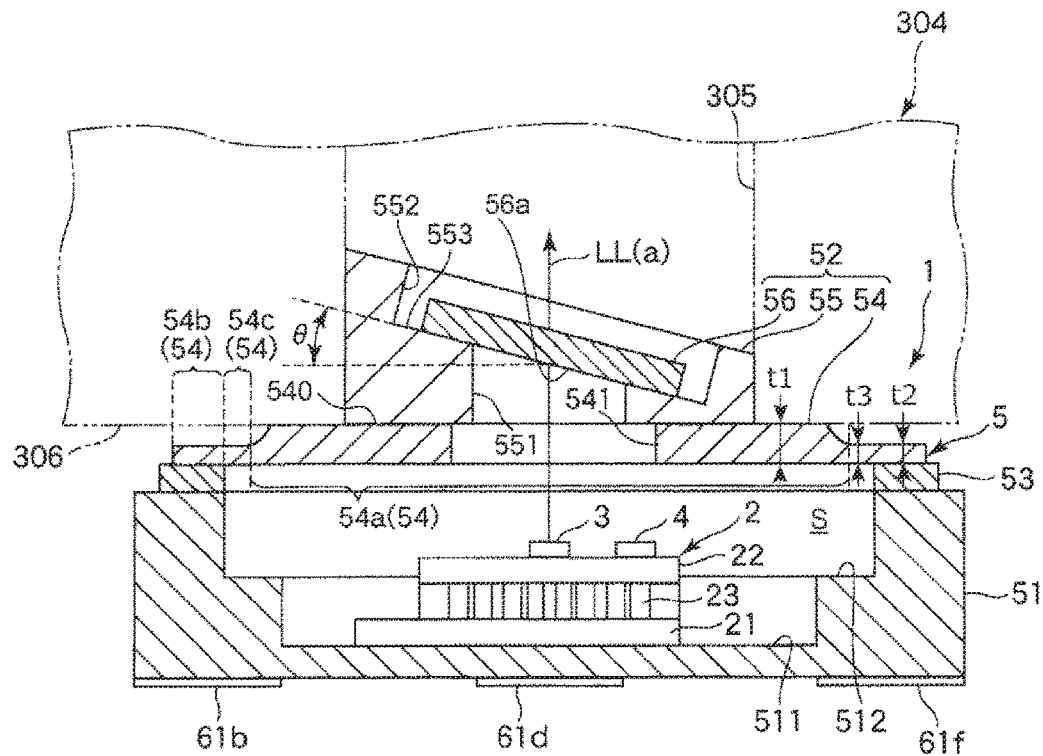
FIG. 4 is a sectional view illustrating a light-emitting element module included in the atomic oscillator illustrated in FIGS. 2 and 3.
Figure 5:
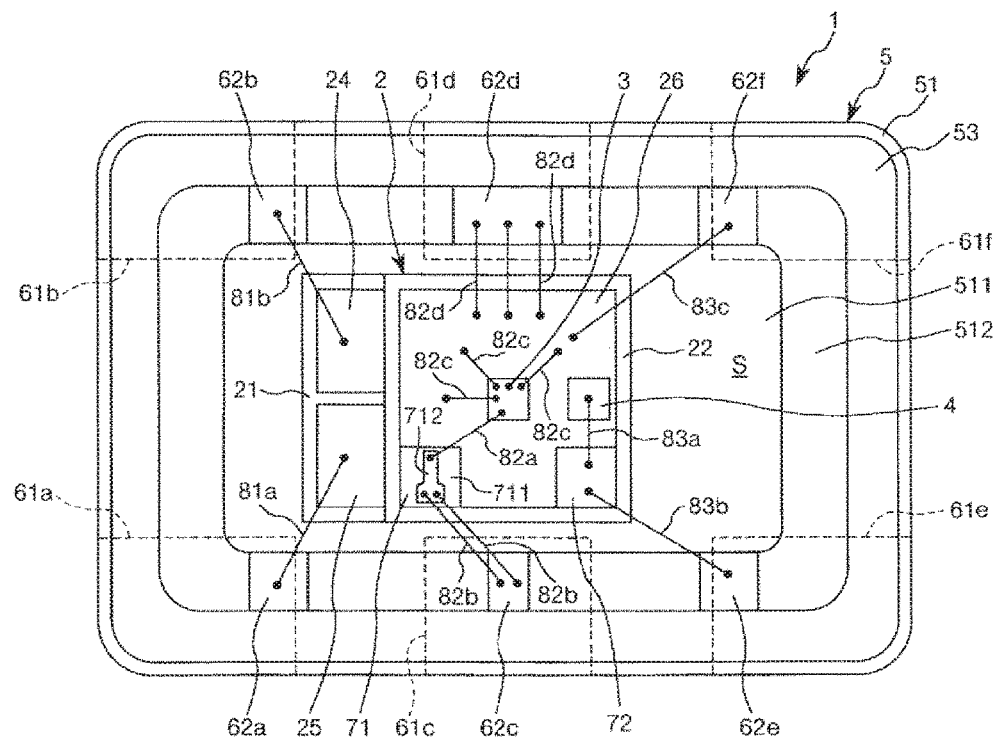
FIG. 5 is a plan view illustrating the light-emitting element module illustrated in FIG. 4.
Figure 6:
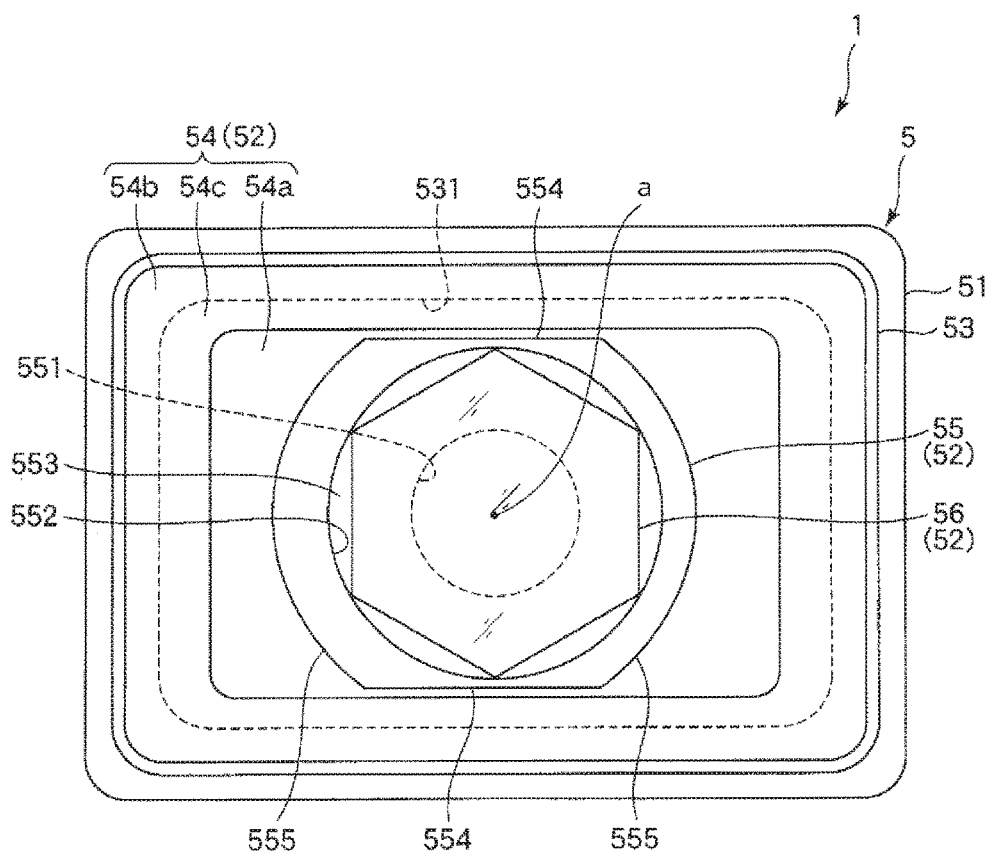
FIG. 6 is a plan view illustrating a lid included in the light-emitting element module illustrated in FIG. 4.
Figure 7:
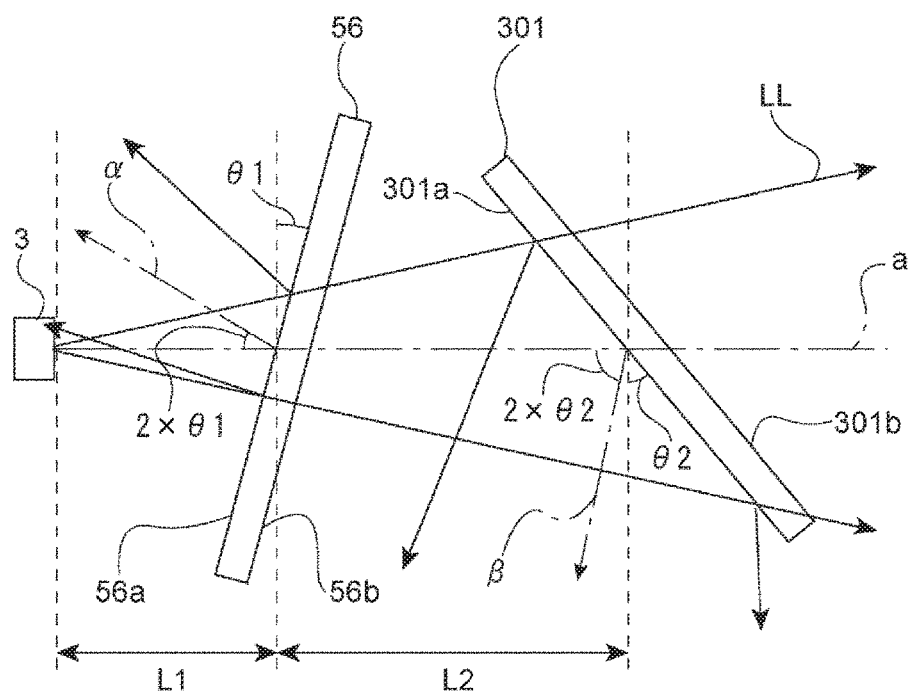
FIG. 7 is a schematic diagram illustrating first and second optical elements included in the atomic oscillator illustrated in FIG. 2.
Figure 8:
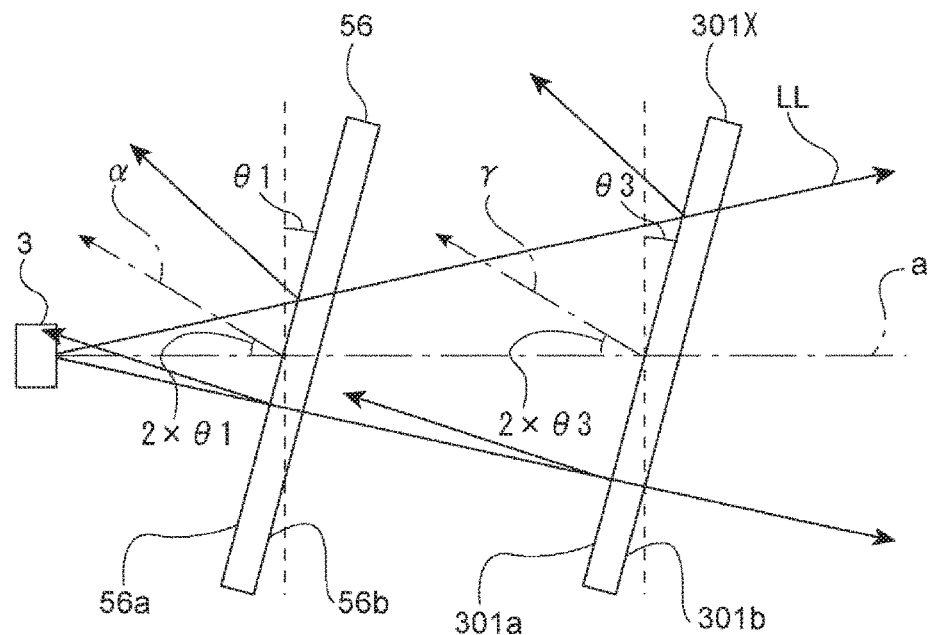
FIG. 8 is a schematic diagram illustrating a case (comparative example) in which the first and second optical elements are disposed in parallel.

FIG. 4 is a sectional view illustrating the light-emitting element module included in the atomic oscillator illustrated in FIGS. 2 and 3. FIG. 5 is a plan view illustrating the light-emitting element module illustrated in FIG. 4. FIG. 6 is a plan view illustrating a lid included in the light-emitting element module illustrated in FIG. 4. FIG. 7 is a schematic diagram illustrating first and second optical elements included in the atomic oscillator illustrated in FIG. 2. FIG. 8 is a schematic diagram illustrating a case in which the first and second optical elements are disposed in parallel. Hereinafter, to facilitate the description, the upper side in FIG. 4 is referred to as a "top" and the lower side is referred to as a "bottom".

As illustrated in FIG. 4, the light-emitting element module 1 includes the Peltier device 2, the light-emitting element 3, the temperature sensor 4, and the package 5 that accommodates them.

The package 5 includes a base 51 that includes a depression portion 511 open toward the upper surface of the base 51 and a lid 52 that blocks an opening (upper opening) of the depression portion 511. An inner space S which is an airtight space in which the Peltier device 2, the light-emitting element 3, and the temperature sensor 4 are accommodated is formed between the base 51 and the lid 52. It is preferable that the package 5 is in a depressurized (vacuum) state internally. In this way, it is possible to reduce an influence of a change in the external temperature of the package 5 on the light-emitting element 3, the temperature sensor 4, or the like inside the package 5 and reduce a variation in the temperature of the light-emitting element 3, the temperature sensor 4, or the like inside the package 5. The package 5 may not be in the depressurized state and an inert gas such as nitrogen, helium, or argon may be sealed.

A material of the base 51 is not particularly limited. A material that has an insulation property and is suitable for forming the inner space S as an airtight space, for example, various kinds of ceramics such as oxide-based ceramics such as alumina, silica, titania, and zirconia, nitride-based ceramics such as silicon nitride, aluminum nitride, and titanium nitride, and carbide-based ceramics such as silicon carbide, can be used.

The base 51 includes a stepped portion 512 that is on the upper side of the bottom surface of the depression portion 511 and is formed to surround the outer circumference of the bottom surface of the depression portion 511. As illustrated in FIG. 5, connection electrodes 62a, 62b, 62c, 62d, 62e, and 62f are installed on the upper surface of the stepped portion 512. The connection electrodes 62a, 62b, 62c, 62d, 62e, and 62f (hereinafter also referred to as "connection electrodes 62a to 62f") are electrically connected to external mounting electrodes 61a, 61b, 61c, 61d, 61e, and 61f (hereinafter also referred to as "external mounting electrodes 61a to 61f) installed on the lower surface of the base 51 via through-electrodes (not illustrated) penetrating the base 51, respectively.

Materials of the connection electrodes 62a to 62f and the external mounting electrodes 61a to 61f are not particularly limited. For example, metal materials such as gold (Au), a gold alloy, platinum (Pt), aluminum (Al), an aluminum alloy, silver (Ag), a silver alloy, chromium (Cr), a chromium alloy, nickel (Ni), copper (Cu), molybdenum (Mo), niobium (Nb), tungsten (W), iron (Fe), titanium (Ti), cobalt (Co), zinc (Zn), and zirconium (Zr) can be exemplified.

A seal ring 53 with a frame shape (circular shape) is installed on the upper end surface of the base 51. The seal ring 53 is formed of, for example, a metal material such as Kovar and is joined to the base 51 by soldering or the like. The lid 52 is joined to the base 51 via the seal ring 53 by seam welding or the like.

As illustrated in FIGS. 4 and 6, the lid 52 includes a body portion 54 that has a plate shape, a protrusion portion 55 that is installed on the body portion 54 and has a cylindrical shape, and a window portion 56 that blocks a hole 551 (opening) formed inside the protrusion portion 55.

The body portion 54 includes a first portion 54a that holds the protrusion portion 55, a second portion 54b that is joined to the base 51 (more specifically, the base 51 via the seal ring 53), and a third portion 54c that connects the first portion 54a to the second portion 54b. Here, a thickness t2 of the second portion 54b and a thickness t3 of the third portion 54c are thinner than a thickness t1 of the first portion 54a. The thickness t2 of the second portion 54b is the same as the thickness t3 of the third portion 54c. In the embodiment, when outer circumference of the thicknesses t2 and t3 of the body portion 54 is divided into two portions using the inner circumference edge 531 of the seal ring 53 as a boundary in a plan view, the outer portion of the two portions can be said to be the second portion 54b and the inner portion can be said to be the third portion 54c. The thickness of the outer circumference portion of the first portion 54a is continuously thinned toward the third portion 54c. In this way, the upper surface and the lower surface of the first portion 54a are continuously connected to the upper surface and the lower surface of the third portion 54c. A hole 541 penetrated in the thickness direction is formed in the first portion 54a. At least apart of the light LL from the light-emitting element 3 passes through the hole 541. A material of the body portion 54 is not particularly limited. A metal material is suitably used. It is preferable to use a metal material with a linear expansion coefficient similar to that of the material of the base 51. Accordingly, for example, when the base 51 is formed of a ceramics substrate, it is preferable to use an alloy such as Kovar as the material of the body portion 54.

The protrusion portion 55 includes a hole 551 that communicates with the hole 541 of the above-described body portion 54 and a hole 552 that communicates with the hole 551 opposite to the hole 541 with respect to the hole 551 therein. At least apart of the light LL from the light-emitting element 3 passes through each of the holes 551 and 552. Here, the width (diameter) of the hole 552 is greater than the width (diameter) of the hole 551. In this way, a stepped portion 553 is formed between the holes 551 and 552. The stepped portion 553 is inclined at an inclination angle θ with respect to the plate surface of the above-described body portion 54. As illustrated in FIG. 6, the outer circumferential surface of the protrusion portion 55 includes a pair of curve surfaces 555 that are formed along the cylindrical surface and a pair of flat portions 554 that are flat and installed between the pair of curve surfaces 555. The pair of flat portions 554 are formed along the external shape of the first portion 54a of the body portion 54 in a plan view. Thus, the third portion 54c of the above-described body portion 54 is ensured. By forming the one pair of flat portions 554, it is easy to weld the base 51 and the lid 52. By forming the one pair of curve surfaces 555, it is possible to ensure a necessary mechanical strength of the protrusion portion 55.

A material of the protrusion portion 55 may be different from the material of the body portion 54. However, it is preferable to use a metal material with a linear expansion coefficient similar to that of the material of the body portion 54 and it is more preferable to use the same material as the material of the body portion 54. The protrusion portion 55 may be formed to be separate from the body portion 54 to be joined by a known joining method or may be formed to be integrated (collectively) with the body portion 54 using a mold.

The window portion 56 formed of a plate-shaped member through which the light LL passes is installed inside the hole 552. The window portion 56 is joined onto the above-described stepped portion 553 by a known joining method and blocks the opening of the hole 551 of the above-described protrusion portion 55 on the side of the hole 552. Here, since the stepped portion 553 is inclined at the inclination angle θ with respect to the plate surface 540 of the body portion 54, as described above, the surface 56a of the window portion 56 on the side of the light-emitting element 3 is also inclined at the inclination angle θ with respect to the plate surface 540 of the body portion 54. The inclination angle θ is not particularly limited and is preferably equal to or greater than 5 degrees and equal to or less than 45 degrees and more preferably equal to or greater than 5 degrees and equal to or less than 20 degrees. In this way, it is possible to reduce an adverse influence on the characteristics of the light-emitting element 3 due to reflection of the light LL from the light-emitting element 3 by the window portion 56 and incidence of the light as return light on the light-emitting element 3 while exerting necessary optical characteristics of the window portion 56 with a relatively simple configuration. The window portion 56 has a transmission property for the light LL from the light-emitting element 3. A material of the window portion 56 is not particularly limited. For example, a glass material can be exemplified. The window portion 56 may be an optical component such as a lens or a light reduction filter.

On the lid 52, as illustrated in FIG. 4, the body portion 54 and the protrusion portion 55 engage with the holder 304 of the above-described optical system unit 30 to be positioned. More specifically, the plate surface of the body portion 54 comes into contact with a positioning surface 306 of the holder 304, so that the lid 52 and the light-emitting element module 1 are positioned in the direction of the optical axis a of the light-emitting element 3. When the protrusion portion 55 is inserted into the through-hole 305 of the holder 304 and side surfaces (more specifically, the one pair of curve surfaces 555 described above) of the protrusion portion 55 come into contact with the inner wall surface of the through-hole 305, the lid 52 and the light-emitting element module 1 are positioned in a direction vertical to the optical axis a of the light-emitting element 3. By bringing the body portion 54 and the protrusion portion 55 into contact with the holder 304 in this way, it is possible to reduce the temperature of the lid 52 through heat dissipation from the holder 304 formed of a metal material and thus having a heat dissipation property.

The Peltier device 2 is disposed on the bottom surface of the depression portion 511 of the base 51 of the package 5. The Peltier device 2 is fixed to the base 51 by, for example, an adhesive. As illustrated in FIG. 4, the Peltier device 2 includes a pair of substrates 21 and 22 and a joint 23 installed between the substrates 21 and 22. The substrates 21 and 22 are formed of a material that has excellent thermal conductivity, such as a metal material or a ceramics material. Insulation films are formed on the surfaces of the substrates 21 and 22, as necessary. The lower surface of the substrate 21 is fixed to the base 51 of the package 5. On the other hand, a pair of terminals 24 and 25 are installed on the upper surface of the substrate 21, as illustrated in FIG. 5. The substrate 22 is installed so that the pair of terminals 24 and 25 are exposed. The pair of terminals 24 and 25 are electrically connected to the connection electrodes 62a and 62b installed in the package 5 via interconnections 81a and 81b which are wire interconnections (bonding wires). The joint 23 is configured to include a plurality of joints of two types of different metals or semiconductors that generate the Peltier effect by conduction from the pair of terminals 24 and 25.

In the Peltier device 2, one of the substrates 21 and 22 serves as a heat generator side and the other substrate serves as a heat absorber side by the Peltier effect generated in the joint 23. Here, in the Peltier device 2, according to a direction of a current to be supplied, a state in which the substrate 21 serves as the heat generator side and the substrate 22 serves as the heat absorber side and a state in which the substrate 21 serves as the heat absorber side and the substrate 22 serves as the heat generator side can be switched. Therefore, even when the range of an environmental temperature is broad, the temperature of the light-emitting element 3 or the like can be adjusted to a desired temperature (target temperature). In this way, it is possible to further reduce an adverse influence (for example, a variation in the wavelength of the light LL) due to a change in temperature. Here, a target temperature (Tv) of the light-emitting element 3 can be decided according to the characteristics of the light-emitting element 3 and is not particularly limited. For example, the target temperature is equal to or greater than about 30° C. and equal to or less than about 40° C. The Peltier device 2 is operated at an appropriate timing based on information from the temperature sensor 4 to heat or cool the light-emitting element 3 so that the temperature of the light-emitting element 3 is maintained as the target temperature.

The Peltier device 2 includes a metal layer 26 installed on the upper surface of the substrate 22. The metal layer 26 is formed of, for example, a metal having excellent thermal conductivity, such as aluminum, gold, or silver. The light-emitting element 3, the temperature sensor 4, and relay members 71 and 72 are disposed on the upper surface of the metal layer 26.

The light-emitting element 3 is, for example, a semiconductor laser such as a vertical cavity surface emitting laser (VCSEL). The semiconductor layer can emit two types of light with different wavelengths by superimposing a high-frequency signal on a direct-current bias current (performing modulation) for use. The light-emitting element 3 includes a pair of terminals (not illustrated). Of the pair of terminals, one terminal is a drive signal terminal and the other terminal is a grounding terminal. The drive signal terminal is electrically connected to the connection electrode 62c installed in the package 5 via the interconnection 82a, the relay member 71, and the interconnection 82b. On the other hand, the grounding terminal is electrically connected to the connection electrode 62d installed in the package 5 via the interconnection 82c, the metal layer 26, and the interconnection 82d.

The temperature sensor 4 is, for example, a temperature detection element such as a thermistor or a thermocouple. The temperature sensor 4 includes a pair of terminals (not illustrated). Of the pair of terminals, one terminal is a detection signal terminal and the other terminal is a grounding terminal. The detection signal terminal is electrically connected to the connection electrode 62e installed in the package 5 via the interconnection 83a, the relay member 72, and the interconnection 83b. On the other hand, the grounding terminal is electrically connected to the connection electrode 62f installed in the package 5 via the metal layer 26 and the interconnection 83c.

The interconnections 82a, 82b, 82c, 82d, 83a, 83b, and 83c are wire interconnections (bonding wires). Here, the interconnection 82b is configured by a plurality of wire interconnections. In this way, it is possible to reduce electric resistance of the interconnection 82b and reduce loss of a driving signal supplied to the light-emitting element 3. From the same viewpoint, the interconnections 82c and 82d are also configured by a plurality of wire interconnections.

The relay member 71 includes a base portion 711 that has an insulation property and an interconnection layer 712 that has conductivity and is installed on the upper surface of the base portion 711. The base portion 711 is formed of, for example, a ceramics material. A metal layer (not illustrated) is joined to the lower surface of the base portion 711. The metal layer is joined to the metal layer 26 with a joining material (not illustrated) such as a brazing filler metal. The interconnection layer 712 is formed of the same material as that of the above-described connection electrodes 62a to 62f. The interconnection layer 712 is formed in a rectangular shape and is formed in a part of the upper surface of the base portion 711. In this way, even when an electrostatic capacitance between the interconnection layer 712 and the metal layer 26 is small and a high-frequency signal is used as a driving signal supplied to the light-emitting element 3, it is possible to reduce loss of the driving signal. In addition, it is possible to ensure the size of the base portion 711 to some extent and consequently facilitate mounting of the relay member 71.

By electrically connecting the light-emitting element 3 to the connection electrodes 62c and 62d via the relay member 71 and the like, the temperature of the interconnections 82a, 82b, 82c, and 82d is adjusted by the Peltier device 2. Therefore, it is possible to reduce the variation in the temperature of the interconnections 82a, 82b, 82c, and 82d and also accordingly reduce the variation in the temperature of the light-emitting element 3.

The relay member 72 can be configured similarly to the above-described relay member 71. However, since no high-frequency signal is used in the temperature sensor 4, the interconnection layer included in the relay member 72 may be installed across the entire region of the upper surface of the base portion.

By electrically connecting the temperature sensor 4 to the connection electrodes 62e and 62f via the relay member 72 and the like, the temperature of the interconnections 83a, 83b, and 83c is adjusted by the Peltier device 2. Therefore, it is possible to reduce the variation in the temperature of the interconnections 83a, 83b, and 83c and also accordingly reduce the variation in the temperature of the temperature sensor 4. That is, the temperature sensor 4 can be allowed to be rarely affected by heat from the connection electrodes 62e and 62f. Therefore, it is possible to improve detection precision of the temperature sensor 4 and consequently control the temperature of the light-emitting element 3 with high precision.

The atomic oscillator 10 that has the above-described configuration includes the atomic cell 201 in which an alkali metal is sealed, the light-emitting element 3 that emits the light LL to be radiated to the atomic cell 201, the light-receiving element 202 that detects the light LL transmitted through the atomic cell 201, the window portion which is a "first optical element" that has light transmittance and is disposed between the atomic cell 201 and the light-emitting element 3, and the light reduction filter 301 which is a "second optical element" that has light transmittance and is disposed between the window portion 56 and the atomic cell 201.

Here, the window portion 56 which is the "first optical element" includes a first surface 56a that is inclined with respect to the surface (plate surface 540) having the optical axis a of the light LL as a normal line, and the first surface 56a reflects the light from the light-emitting element 3 at first light reflectivity. In this way, as illustrated in FIG. 7, the window portion 56 which is the "first optical element" has the first light reflectivity and reflects the light LL from the light-emitting element 3 in a first direction α inclined with respect to the optical axis a of the light LL toward the light-emitting element 3.

On the other hand, the light reduction filter 301 which is the "second optical element" includes a second surface 301a that is inclined on the opposite side (different direction) to the first surface 56a with respect to the surface (the plate surface 540) having the optical axis a of the light LL as a normal line, and the second surface 301a reflects the light LL from the light-emitting element 3 at second light reflectivity higher than the first light reflectivity. In this way, the light reduction filter 301 which is the "second optical element" has the second light reflectivity higher than the first light reflectivity and reflects the light LL from the light-emitting element 3 toward the light-emitting element 3 in a second direction β inclined on the opposite side (a different direction) to the first direction α with respect to the optical axis a of the light LL. The inclination direction of the second surface 301a and the second direction β may be different from the inclination direction of the first surface 56a and the first direction α and is not limited to the illustrated direction. For example, the illustrated inclination direction may be a direction rotated at 30°, 60°, 90°, 180°, or 210° about the optical axis a.

In the atomic oscillator 10, the window portion 56 (the first optical element) and the light reduction filter 301 (the second optical element) each reflect the light LL from the light-emitting element 3 toward the light-emitting element 3 in the directions inclined with respect to the optical axis a of the light LL. Therefore, it is possible to reduce return light to the light-emitting element 3. In particular, the light reduction filter 301 reflects the light LL from the light-emitting element 3 in the direction (the second direction β) inclined on the opposite side to (different direction from) the reflection direction (the first direction α) in the window portion 56 with respect to the optical axis a. Therefore, as in a comparative example illustrated in FIG. 8, light reflected by a light reduction filter 301X is multiply reflected between the window portion 56 and the light reduction filter 301X, and thus it is possible to reduce return light to the light-emitting element 3. As a result, even when the second light reflectivity is higher than the first light reflectivity, it is possible to effectively reduce the return light to the light-emitting element 3. In this way, it is possible to improve stability of the wavelength of the light LL from the light-emitting element 3 and improve oscillation characteristics of the atomic oscillator 10. Even in the surface 56b of the window portion 56 on the side of the lens 302 and the surface 301b of the light reduction filter 301 on the side of the lens 302, the same operation effect can be obtained. The light reduction filter 301X illustrated in FIG. 8 is the same as the light reduction filter 301 except that the second surface 301a is inclined at the same angle θ3 and in the same direction γ as the first surface 56a with respect to the surface having the optical axis a of the light LL as the normal line.

Here, the inclination angle θ2 of the second surface 301a with respect to the surface having the optical axis a of the light LL as the normal line is greater than the inclination angle θ1 of the first surface 56a with respect to the surface having the optical axis a of the light LL as the normal line. Accordingly, an inclination angle (2×θ2) in the second direction β with respect to the optical axis a of the light LL is greater than an inclination angle (2×θ1) in the first direction α with respect to the optical axis a of the light LL. In this way, it is possible to effectively reduce the return light of the light LL reflected by the light reduction filter 301 with large light reflectivity to the light-emitting element 3, and thus it is possible to reduce an influence of the return light on the light-emitting element 3 (for example, a variation in the wavelength of the light LL due to an increase in temperature). On the other hand, by causing the inclination angle θ1 of the first surface 56a with respect to the surface having the optical axis a of the light LL from the light-emitting element 3 as the normal line to be less than the inclination angle θ2 of the second surface 301a (that is, by causing the inclination angle in the first direction α with respect to the optical axis a of the light LL from the light-emitting element 3 to be less than the inclination angle in the second direction β), it is possible to exert the necessary optical characteristics of the window portion 56 (for example, sufficient transmittance of the light LL) with a relatively simple configuration. Here, the first light reflectivity is lower than the second light reflectivity. Therefore, even when the inclination angle θ1 of the first surface 56a with respect to the surface having the optical axis a of the light LL from the light-emitting element 3 as the normal line is set to be less than the inclination angle θ2 of the second surface 301a, the influence of the return light to the light-emitting element 3 is small.

The inclination angle θ1 is preferably equal to or greater than 5 degrees and equal to or less than 45 degrees and more preferably equal to or greater than 5 degrees and equal to or less than 20 degrees. In this way, while exerting the necessary optical characteristics of the window portion 56 in the relatively simple configuration, it is possible to reduce the adverse influence on the characteristics of the light-emitting element 3 due to reflection of the light LL from the light-emitting element 3 by the window portion 56 and incidence of the light as the return light on the light-emitting element 3. A difference (θ2−θ1) between the inclination angles θ1 and θ2 is not particularly limited, but is preferably equal to or greater than 5 degrees and equal to or less than 40 degrees, more preferably equal to or greater than 15 degrees and equal to or less than 35 degrees, and further more preferably equal to or greater than 20 degrees and equal to or less than 30 degrees. In this way, it is possible to effectively reduce the return light to the light-emitting element 3 from the reflected light in the window portion 56 and the light reduction filter 301.

A distance L2 between the window portion 56 and the light reduction filter 301 on the optical axis a is preferably greater than a distance L1 between the light-emitting element 3 and the window portion 56 on the optical axis a. In this way, while lowering the profile of the light-emitting element module 1, it is possible to effectively reduce the return light to the light-emitting element 3 from the reflected light in the light reduction filter 301.

The light reduction filter 301 which is the "second optical element" is preferably a reflective light reduction filter. In this way, it is possible to reduce the light LL from the light-emitting element 3 to radiate the light LL to the atomic cell 201. The reflective light reduction filter has the advantage that a problem of an increase in temperature caused due to light absorption as in an absorption light reduction filter rarely arises. Therefore, when the light reduction filter 301 is the reflective light reduction filter, it is possible to also reduce a variation in the wavelength of the light LL due to a variation in the temperature of the light-emitting element 3 due to transmission of heat produced by the light reduction filter 301 to the light-emitting element 3.

Further, as described above, the atomic oscillator 10 includes the atomic cell 201 and the lens 302 disposed between the atomic cell 201 and the light reduction filter 301 which is the "second optical element". In this way, it is possible to adjust the radiation angle of the light LL from the light-emitting element 3. Even when the lens 302 is disposed along the surface vertical to the optical axis a of the light LL from the light-emitting element 3, the reflected light in the lens 302 is reflected by each of the first and second optical elements (for example, reflected by the surface 56b of the window portion 56 on the side of the lens 302 and the surface 301b of the light reduction filter 301 on the side of the lens 302), and thus it is possible to reduce the return light to the light-emitting element 3 from the reflected light. Since it is not necessary to dispose another lens between the light-emitting element 3 and the light reduction filter 301, the reflected light in the lens disposed in this way does not become the return light to the light-emitting element 3.

As described above, the atomic oscillator 10 includes the quarter wavelength plate 303 disposed between the atomic cell 201 and the light reduction filter 301 which is the "second optical element". In this way, polarization of the light LL from the light-emitting element 3 can be converted from linear polarization to circular polarization. As in the reflected light in the above-described lens 302, it is possible to reduce the return light to the light-emitting element 3 from the reflected light in the quarter wavelength plate 303. In addition, since it is not necessary to dispose another quarter wavelength plate between the light-emitting element 3 and the light reduction filter 301, the reflected light in the quarter wavelength plate disposed in this way does not become the return light to the light-emitting element 3.

Further, the atomic oscillator 10 includes the lid 52 (more accurately, a structure formed by the body portion 54 and the protrusion portion 55) which is a "first holding member" holding the window portion 56 which is the "first optical element" and the holder 304 which is a "second holding member" holding the light reduction filter 301 which is the "second optical element". The lid 52 includes the protrusion portion 55 and the body portion 54 which are a "first engagement portion". The holder 304 includes the positioning surface 306 and the through-hole 305 which are a "second engagement portion" engaging with the body portion 54 and the protrusion portion 55. The engagement of the body portion 54 and the positioning surface 306 and the engagement of the protrusion portion 55 and the through-hole 305 enable the lid 52 and the holder 304 to be relatively positioned. In this way, it is possible to mutually position the window portion 56 and the light reduction filter 301 simply and at high precision.

The atomic oscillator 10 includes the package 5 that accommodates the light-emitting element 3. The window portion 56 which is the "first optical element" and the lid 52 which is the "first holding member" configure a part of the package 5. In this way, it is also possible to mutually position the light-emitting element 3 and the window portion 56 simply and at high precision. Since the window portion 56 can be installed at a relatively small inclination angle, it is possible to reduce the size of the package 5. The package 5 (more accurately, a structure excluding the window portion 56 from the package 5) can also be comprehended as the "first holding member". In this way, the first holding member can be said to configure the package 5.

2. Electronic Apparatus

The light-emitting element module 1 and the atomic oscillator 10 described above can be embedded in various electronic apparatuses. Hereinafter, an electronic apparatus according to the invention will be described.

Figure 9:
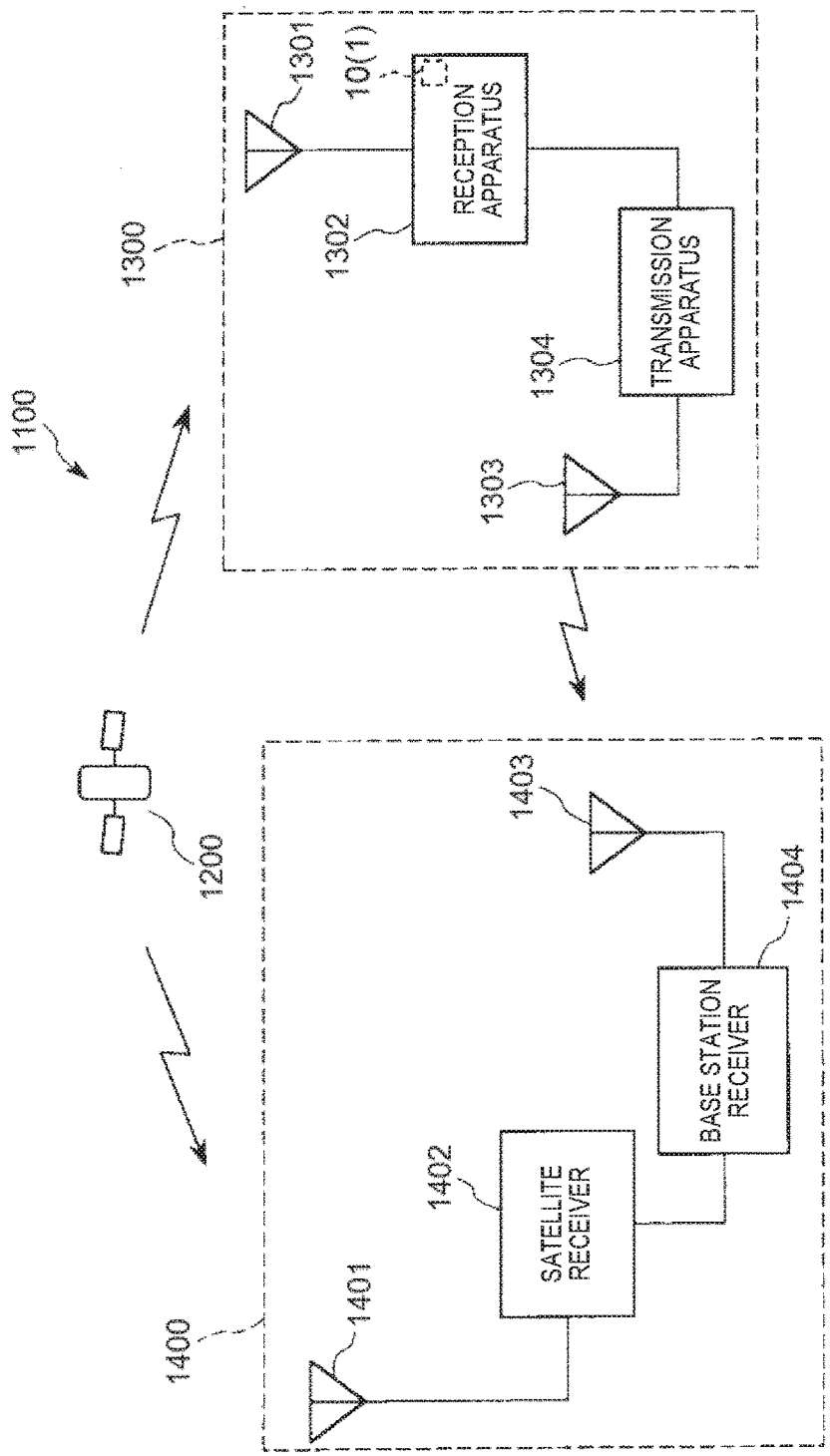
FIG. 9 is a diagram illustrating a schematic configuration when the atomic oscillator is used in a positioning system using GPS satellites.

FIG. 9 is a diagram illustrating a schematic configuration when the atomic oscillator is used in a positioning system using GPS satellites.

A positioning system 1100 illustrated in FIG. 9 is configured to include a GPS satellite 1200, a base station apparatus 1300, and a GPS reception apparatus 1400.

The GPS satellite 1200 transmits positioning information (a GPS signal).

The base station apparatus 1300 includes a reception apparatus 1302 that receives the positioning information with high precision from the GPS satellite 1200 via an antenna 1301 installed at, for example, an electronic standard point (GPS continuous observation station) and a transmission apparatus 1304 that transmits the positional information received by the reception apparatus 1302 via an antenna 1303.

Here, the reception apparatus 1302 is an electronic apparatus that includes the above-described atomic oscillator 10 (the light-emitting element module 1) as a standard frequency oscillation source. The positional information received by the reception apparatus 1302 is transmitted in real time by the transmission apparatus 1304.

The GPS reception apparatus 1400 includes a satellite receiver 1402 that receives the positioning information from the GPS satellite 1200 via an antenna 1401 and a base station receiver 1404 that receives the positional information from the base station apparatus 1300 via an antenna 1403.

The reception apparatus 1302 which is an "electronic apparatus" included in the above-described positioning system 1100 includes the atomic oscillator 10. In this way, it is possible to improve characteristics of the reception apparatus 1302 using excellent oscillation characteristics of the atomic oscillator 10.

The reception apparatus 1302 which is an "electronic apparatus" included in the foregoing positioning system 1100 includes the above-described light-emitting element module 1. In this way, it is possible to reduce a variation in the temperature of the light-emitting element 3 using the Peltier device 2 even at high temperature.

The electronic apparatus is not limited to the above-described electronic apparatus. The invention can be applied to, for example, a smartphone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation apparatus, a pager, an electronic organizer (also including a communication function unit), an electronic dictionary, a calculator, an electronic game apparatus, a word processor, a workstation, a television telephone, a security television monitor, electronic binoculars, a POS terminal, a medical apparatus (for example, an electronic thermometer, a blood-pressure meter, a blood-sugar meter, an electrocardiographic apparatus, an ultrasonic diagnostic apparatus, or an electronic endoscopy), a fish finder, various measurement apparatuses, meters (for example, meters for cars, airplanes, and ships), a flight simulator, a digital terrestrial broadcast, and a mobile phone base station.

3. Vehicle

Figure 10:
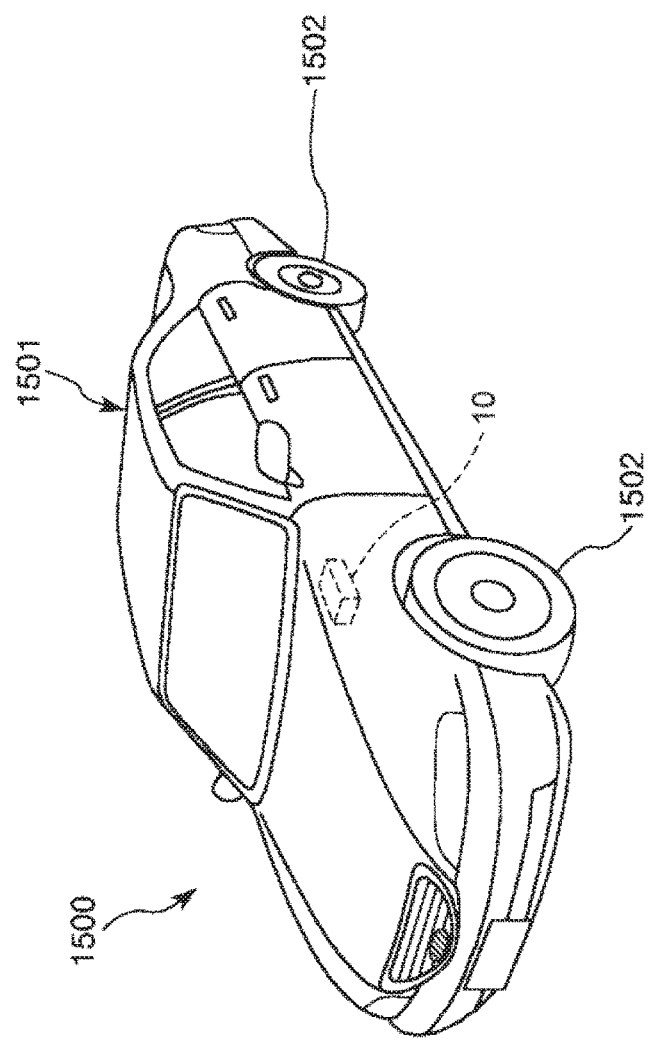
FIG. 10 is a diagram illustrating an example of a vehicle.

FIG. 10 is a diagram illustrating an example of a vehicle.

In the drawing, a vehicle 1500 includes a body 1501 and four wheels 1502 and is configured to rotate the wheels 1502 by a power source (engine) (not illustrated) installed in the body 1501. The vehicle 1500 contains the atomic oscillator 10 (the light-emitting element module 1).

The above-described vehicle 1500 includes the atomic oscillator 10. In this way, it is possible to improve characteristics of the vehicle 1500 using excellent oscillation characteristics of the atomic oscillator 10.

The atomic oscillator, the electronic apparatus, and the vehicle according to the invention have been described above according to the illustrated embodiments, but the invention is not limited thereto.

The configuration of each unit according to the invention can be replaced with any configuration that has the same function as that according to the above-described embodiment and any configuration can also be added.

In the above-described embodiment, the case has been described in which the invention is applied to the atomic oscillator that resonantly transitions cesium or the like using coherent population trapping by two kinds of light with different wavelengths, but the invention is not limited thereto. The invention can also be applied to an atomic oscillator that resonantly transitions rubidium or the like using a double resonance phenomenon by light and microwaves.

What is claimed is:

1. An atomic oscillator comprising:
an atomic cell in which an alkali metal is sealed;
a light-emitting element that emits light;
a first optical element that has light transmittance and is disposed between the atomic cell and the light-emitting element;
a second optical element that has light transmittance and is disposed between the first optical element and the atomic cell; and
a light-receiving element that detects the light transmitted through the atomic cell,
wherein the first optical element reflects the light from the light-emitting element toward the light-emitting element in a first direction inclined with respect to an optical axis of the light, and
wherein the second optical element reflects the light from the light-emitting element toward the light-emitting element in a second direction inclined in a direction different from the first direction with respect to the optical axis.

2. The atomic oscillator according to claim 1,
wherein an inclination angle of the second direction with respect to the optical axis is greater than an inclination angle of the first direction with respect to the optical axis.

3. An atomic oscillator comprising:
an atomic cell in which an alkali metal is sealed;
a light-emitting element that emits light;
a first optical element that has light transmittance and is disposed between the atomic cell and the light-emitting element, the first optical element including a first surface which is inclined with respect to a surface perpendicular to an optical axis of the light and reflects the light from the light-emitting element,
a second optical element that has light transmittance and is disposed between the first optical element and the atomic cell, the second optical element including a second surface which is inclined in a different direction from the first surface with respect to the surface perpendicular to the optical axis of the light and reflects the light from the light-emitting element, and
a light-receiving element that detects the light transmitted through the atomic cell.

4. The atomic oscillator according to claim 3,
wherein an inclination angle of the second surface with respect to the surface perpendicular to the optical axis is greater than an inclination angle of the first surface with respect to the surface perpendicular to the optical axis.

5. The atomic oscillator according to claim 1,
wherein the second optical element is a reflective light reduction filter.

6. The atomic oscillator according to claim 1, further comprising:
a lens that is disposed between the atomic cell and the second optical element.

7. The atomic oscillator according to claim 1, further comprising:
a quarter wavelength plate that is disposed between the atomic cell and the second optical element.

8. The atomic oscillator according to claim 1, further comprising:
a first holding member that includes a first engagement portion and holds the first optical element; and
a second holding member that includes a second engagement portion engaging with the first engagement portion and holds the second optical element.

9. The atomic oscillator according to claim 8, further comprising:
a package that accommodates the light-emitting element,
wherein the first optical element and the first holding member being at least a part of the package.

10. The atomic oscillator according to claim 1,
wherein reflectivity of the light of the second optical element is higher than reflectivity of the light of the first optical element.

11. An electronic apparatus comprising:
the atomic oscillator comprising:
an atomic cell in which an alkali metal is sealed;
a light-emitting element that emits light;
a first optical element that has light transmittance and is disposed between the atomic cell and the light-emitting element;
a second optical element that has light transmittance and is disposed between the first optical element and the atomic cell; and
a light-receiving element that detects the light transmitted through the atomic cell,
wherein the first optical element reflects the light from the light-emitting element toward the light-emitting element in a first direction inclined with respect to an optical axis of the light, and
wherein the second optical element reflects the light from the light-emitting element toward the light-emitting element in a second direction inclined in a direction different from the first direction with respect to the optical axis.

* * * * *